United States Patent [19]
Kim et al.

[11] Patent Number: 5,498,497
[45] Date of Patent: Mar. 12, 1996

[54] METHOD FOR MANUFACTURING A PHASE SHIFT MASK

[75] Inventors: Young S. Kim, Seoul; Young M. Ham, Kyoungki-do; Ik B. Huh, Seoul; Hung E. Kim, Kyoungki-do, all of Rep. of Korea

[73] Assignee: Hyundai Electronics Industries, Co., Ltd., Kyoungki-do, Rep. of Korea

[21] Appl. No.: 297,666

[22] Filed: Aug. 29, 1994

Related U.S. Application Data

[63] Continuation of Ser. No. 110,358, Aug. 23, 1993, abandoned.

[30] Foreign Application Priority Data

Aug. 24, 1992 [KR] Rep. of Korea ............... 92-15166

[51] Int. Cl.$^6$ ............................................. G03F 9/00
[52] U.S. Cl. ............................ 430/5; 430/322; 430/324
[58] Field of Search ............................ 430/5, 322, 324

[56] References Cited

U.S. PATENT DOCUMENTS 5,130,263 7/1992 Possin et al. .......................... 430/311
5,169,737 12/1992 Haws ........................................ 430/7

*Primary Examiner*—S. Rosasco
*Attorney, Agent, or Firm*—Morgan & Finnegan

[57] ABSTRACT

A phase shift layer is formed on a transparent glass on which a Cr pattern is formed and a phase shift layer pattern self-aligned by the Cr pattern is formed so that high resolution is obtained by minimized the overlapping error and the reliability of the semiconductor device is improved.

6 Claims, 3 Drawing Sheets

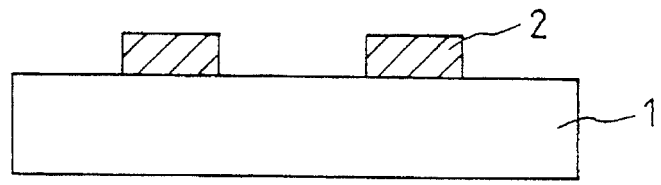
Fig. 1A "Prior Art"
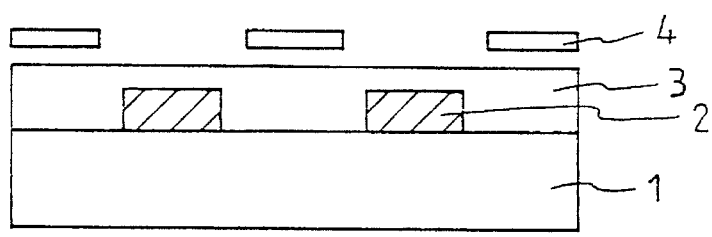
Fig. 1B "Prior Art"
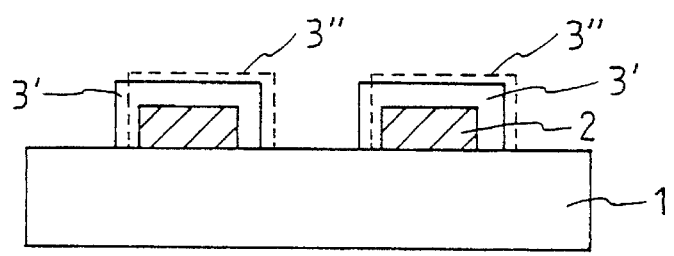
Fig. 1C "Prior Art"

METHOD FOR MANUFACTURING A PHASE SHIFT MASK

This is a continuation of application Ser No. 08/110,358, filed on a Aug 23, 1993, now abandoned.

BACKGROUND OF THE INVENTION

1. Field of the Invention

This invention relates to a method for forming a phase shift mask which can be used during a lithographic process, and more particularly to a method for forming a self-aligned phase shift layer pattern by a Chrome (Cr) pattern which is formed on opposite side of a transparent glass.

2. Information Disclosure Statement

As is generally known, in order to form a pattern on the surface of a wafer, a photo-mask of a Cr pattern which is formed at a predetermined portion of a transparent glass by irradiating an electron beam is used in the lithographic process. However, since a highly integrated semiconductor device has been manufactured, high resolutions capable of forming a microscopic pattern have been required.

Therefore, in order to manufacture the microscopic pattern on the surface of the wafer with high resolution according to the conventional method, a phase shift mask including a phase shift layer pattern with high transmission factor overlapped on a Cr pattern has been manufactured. However, the phase shift pattern and Cr pattern is not accurately overlapped so that it is difficult to form a submicron pattern of the semiconductor device.

With reference to FIG. 1A through FIG. 1C, the conventional method for forming the phase shift mask will now be described.

FIG. 1A is a cross-sectional view illustrating a Cr pattern 2 formed on a transparent glass 1 by irradiating an electron beam.

As shown in FIG. 1B, after a phase shift layer 3 comprising $SiO_2$ or SOG is entirely formed on the transparent glass 1 and the Cr pattern 2, a resist layer (not illustrated) is coated and a mask 4 is positioned on the resist layer in order to form a phase shift layer pattern.

As shown in FIG. 1C, the resist layer, which the mask 4 is not positioned, is exposed by irradiating the electron beam and a resist pattern (not illustrated) is formed by removing only the resist layer which is not exposed by irradiating the election beam. Thereafter phase shift layer pattern 3' is formed by removing the phase shift phase layer 3 exposed by the resist pattern and the resist pattern is removed. Whereby a phase shift mask comprising the phase shift layer pattern 3' is overlapped the Cr pattern 2 is made.

In case of the phase shift pattern 3' is ideally manufactured, a wanted pattern on the surface of the wafer (not illustrated) with high resolution is made because the phase shift effect of the phase shift mask is accurately obtained during the photo-lithographic process. However, when a phase shift layer pattern 3" (shown as the dotted line) and the Cr pattern 2 are manufactured with overlapping error, the phase shift effect of the phase shift mask is not accurately obtained so that the wanted pattern is not achieved during the photo-lithographic process. Therefore, in order to form the pattern on the surface of the wafer with high resolution on the wafer, the overlapping error between both patterns 3', 2 should be minimized.

However, the overlapping accuracy of the phase shift layer pattern on the Cr pattern is not easily increased according to the conventional method since there are many factors to misalign them such as using another mask for forming said phase shift layer pattern, etc. In general, it is very troublesome procedures to accurately align the another mask to Cr pattern during a lithographic process.

SUMMARY OF THE INVENTION

It is an object of this invention to provide a method for forming a phase shift mask which comprising a transparent glass, phase shift layer pattern formed under side of said glass, on the rear surface of a transparent and Chrome (Cr) pattern positioned upper side of said glass, the phase shift layer pattern being self-aligned by the Cr pattern.

To achieve the above objective, after a phase shift layer is formed on a transparent glass on which a Cr pattern is formed, a phase shift layer pattern self-aligned by the Cr pattern is formed.

BRIEF DESCRIPTION OF THE DRAWINGS

For fuller understanding of the nature and objects of the invention, reference should be had to the following detailed description taken in conjunction with the accompanying drawings in which:

FIG. 1A through FIG. 1C are cross-sectional views illustrating a method for manufacturing a phase shift mask according to the conventional method.

DETAILED DESCRIPTION OF THE PREFERRED EMBODIMENTS

Figure 2A:
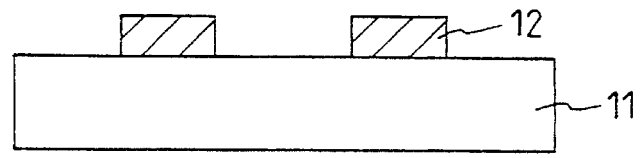
FIG. 2A through FIG. 2D are cross-sectional views illustrating a method for manufacturing a phase shift mask according to the first embodiment of the present invention.

The novel feature of the present invention may be understood from the accompanying description when taken in conjunction with the accompanying drawings similar reference characters refer to similar parts throughout the several views of the drawings.

FIG. 2A through FIG. 2D are cross-sectional views illustrating a method for manufacturing a phase shift mask according to the first embodiment of the present invention.

FIG. 2A is a cross-sectional view illustrating a Cr pattern 12 formed on a transparent glass 11 by irradiating an electron beam as used in the conventional technique.

Figure 2B:
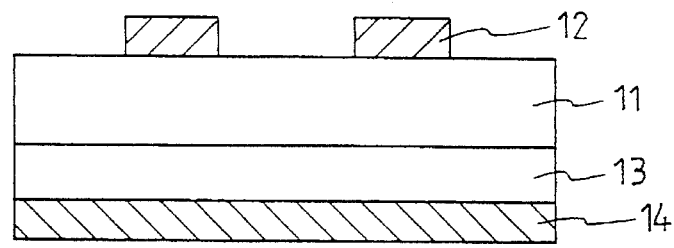

As shown in FIG. 2B, a phase shift layer 13 having high transmittivity, for example, a $SiO_2$ or a SOG, is formed on the surface of the transparent glass 11 which the Cr pattern 12 is not formed. Thereafter, a positive resist 14 is coated over the phase shift layer 13.

Figure 2C:
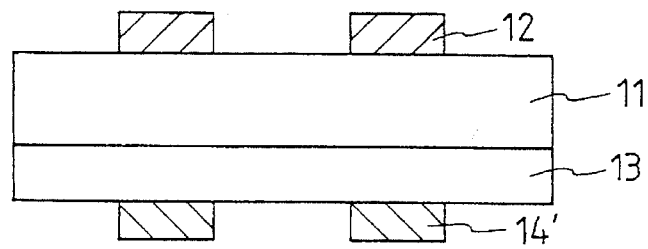

As shown in FIG. 2C, a positive resist 14 is exposed using the Cr pattern 12 as a mask. Thereafter, the exposed positive resist 14 is removed by a developing process so that the self-aligned positive resist pattern 14' is formed.

Figure 2D:
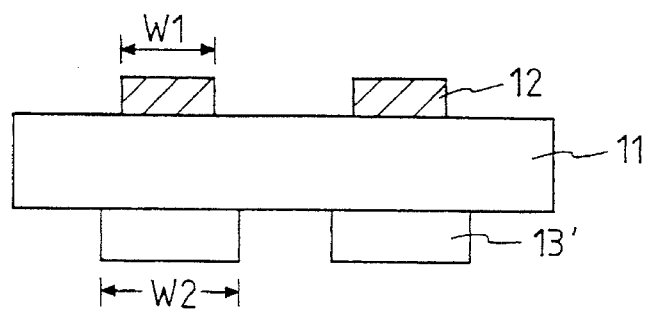

As shown in FIG. 2D, a phase shift pattern 13' is formed by etching slightly the phase shift layer 13 through a wet or dry etching process. In such case, the positive resist pattern 14' is used as a mask. Thereafter, the positive resist pattern 14' is removed.

For obtaining the phase shift effect, width W2 of the phase shift pattern 13' which is lager than width W1 of the Cr pattern 12 is formed as shown in FIG. 2D. Moreover, the self-aligned phase shift pattern 13' is formed so that the overlapping error between the phase shift pattern 13' and Cr pattern 12 is minimized. Therefore, when a wanted pattern (not illustrated) is formed on a wafer using a phase shift mask in the lithographic process, the above phase shift pattern and Cr pattern, high resolution is obtained by the phase shift effect.

FIG. 3A through FIG. 3D are cross-sectional views illustrating a method for manufacturing a phase shift mask according to the second embodiment of the present invention.

Figure 3A:
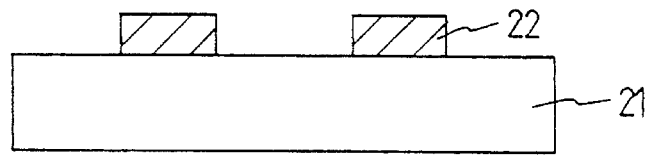
FIG. 3A through 3D are cross-sectional views illustrating a method for manufacturing a phase shift mask according to the second embodiment of the present invention.

FIG. 3A is a cross-sectional view illustrating a Cr pattern 22 formed on a transparent glass 21 by irradiating an electron beam as used in the conventional technique.

Figure 3B:
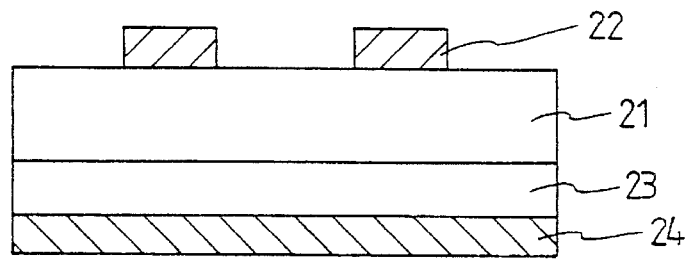

As shown in FIG. 3B, a phase shift layer 23 having high transmittivity, for example, a $SiO_2$ or a SOG, is formed on the surface of the transparent glass 21 which the Cr pattern 22 is not formed. Thereafter, a negative resist 24 is coated over the phase shift layer 23.

Figure 3C:
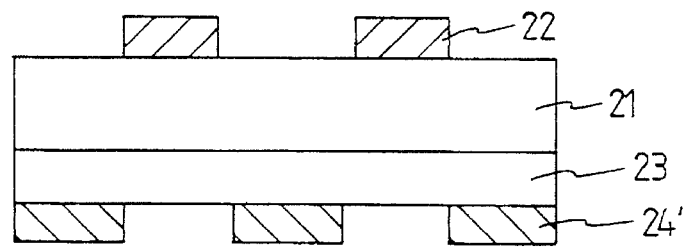

As shown in FIG. 3C, a negative resist 24 is exposed by exposing process using the Cr pattern 22 as a mask. Thereafter, the negative resist 24 which is not exposed is removed by a developing process so that the self-aligned negative resist pattern 24' is formed.

Figure 3D:
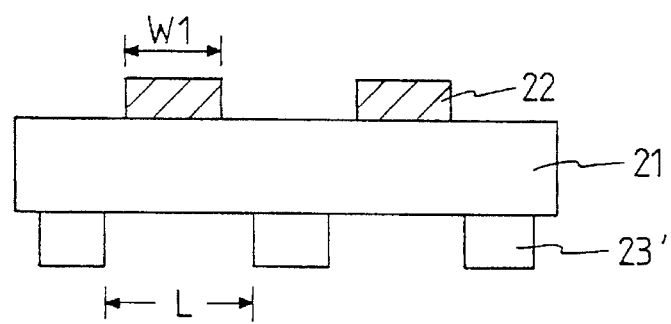

As shown in FIG. 3D, a phase shift pattern 23' is formed by overetching the phase shift layer 23 through a wet or dry etching process. In such case, the negative resist pattern 24' is used as a mask. Thereafter, the negative resist pattern 24' is removed.

For obtaining the phase shift effect, width L between the phase shift patterns 23' which is lager than width W1 of the Cr pattern 22 is formed by overetching the phase shift layer 23 as shown in FIG. 3D. Moreover, the self-aligned phase shift layer pattern 23' is formed so that the overlapping error between the phase shift pattern 23' and Cr pattern 22 is minimized. Therefore, when a wanted pattern (not illustrated) is formed on a wafer using a phase shift mask in the lithographic process, high resolution is obtained by the phase shift effect.

According to the present invention, the phase shift layer is formed on the surface of the transparent glass on which the Cr pattern is not formed so that the self-aligned phase shift pattern is obtained using the Cr pattern. Therefore, high resolution is obtained by minimizing the overlapping error and the reliability of the semiconductor device is improved. Moreover, when the phase shift pattern is formed by casting simply light instead of irradiating the electron beam, the productivity is increased because the manufacturing time is shortened.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit any scope of the invention.

What is claimed is:

1. A method of forming a phase shift mask on a transparent glass during a lithographic process comprising the steps of:

forming a Cr pattern on the transparent glass;

forming a phase shift layer on the rear surface of said transparent glass on which said Cr pattern is formed;

coating a positive resist layer over said phase shift layer;

forming a positive resist pattern by removing an exposed portion of said positive resist layer through an exposing process; and forming a phase shift layer pattern by removing an exposed portion of said phase shift layer through an etching process using said resist positive pattern as a mask.

2. The method of forming said phase shift mask claimed in claim 1, wherein said phase shift layer comprises a $SiO_2$ or a Spin On Glass.

3. The method of forming said phase shift mask claimed in claim 1, wherein said phase shift layer pattern is formed by said etching process for making width (W2) of said phase shift layer pattern wider than width (W1) of said chromium pattern layer.

4. A method of forming a phase shift mask on a transparent glass during a lithographic technique comprising the steps of:

forming a Cr pattern on the transparent glass;

forming a phase shift layer on the rear surface of said transparent glass which said Cr pattern is formed;

coating a negative resist layer over said phase shift layer;

forming a negative resist pattern by removing an unexposed portion of said negative resist layer through an exposing process; and forming a phase shift layer pattern by removing an exposed portion of said phase shift layer through an etching process using said negative resist pattern as a mask.

5. The method of forming said phase shift mask claimed in claim 4, wherein said phase shift layer comprises a $SiO_2$ or a Spin On Glass.

6. The method of forming said phase shift mask claimed in claim 4, wherein said phase shift layer pattern is formed by said etching process for making width (L) of a reverse of said phase shift layer pattern larger than width (W1) of said chromium pattern layer.

* * * * *